United States Patent
Leutgeb et al.

(10) Patent No.: US 7,830,719 B2
(45) Date of Patent: Nov. 9, 2010

(54) POWER DEPENDENT MEMORY ACCESS

(75) Inventors: Thomas Leutgeb, Lieboch (AT); Josef Haid, Graz (AT); Stefan Rueping, Lengdorf (DE)

(73) Assignee: Infineon Technologies AG, Neubiberg (DE)

( * ) Notice: Subject to any disclaimer, the term of this patent is extended or adjusted under 35 U.S.C. 154(b) by 106 days.

(21) Appl. No.: 12/034,864

(22) Filed: Feb. 21, 2008

(65) Prior Publication Data

US 2009/0213679 A1 Aug. 27, 2009

(51) Int. Cl.
*R11C 16/04* (2006.01)

(52) U.S. Cl. .................. 365/185.18; 365/185.28; 365/185.29; 365/233.1

(58) Field of Classification Search ............ 365/185.18, 365/185.28, 185.29, 233.1
See application file for complete search history.

(56) References Cited

U.S. PATENT DOCUMENTS

| | | | | | |
|---|---|---|---|---|---|
| 6,014,332 | A | * | 1/2000 | Roohparvar | 365/185.33 |
| 6,038,166 | A | * | 3/2000 | Wong | 365/185.03 |
| 6,597,605 | B2 | * | 7/2003 | Kreifels et al. | 365/185.28 |
| 2003/0006280 | A1 | * | 1/2003 | Seita et al. | 235/380 |
| 2005/0286310 | A1 | * | 12/2005 | Roohparvar | 365/185.28 |
| 2007/0055821 | A1 | * | 3/2007 | Ootsuka et al. | 711/115 |
| 2007/0291570 | A1 | * | 12/2007 | Roohparvar | 365/227 |
| 2009/0144577 | A1 | * | 6/2009 | Sarker | 713/340 |

* cited by examiner

*Primary Examiner*—Hoai V Ho
(74) *Attorney, Agent, or Firm*—Dickstein Shapiro LLP

(57) ABSTRACT

An apparatus and method of accessing a memory by determining available power, and accessing a number of bits of the memory in parallel, wherein the number of bits accessed in parallel is based at least in part on the available power.

16 Claims, 5 Drawing Sheets

POWER DEPENDENT MEMORY ACCESS

BACKGROUND OF THE INVENTION

The present invention is directed generally to memory access, and in particular to power dependent memory access.

Contactless integrated circuit (IC) cards, also known as chip cards or smart cards, operate on the basis of communication by a radio frequency (RF) or electromagnetic field with a read and/or write interrogating device, generically referred to as a reader.

In contactless IC card applications, the reader typically transmits an RF carrier wave having a carrier frequency of 13.56 MHz. This transmitted carrier wave serves on the one hand to set up a communication between the card and the reader according to an established communication protocol, and on the other hand to power the contactless card, which derives the energy required for its operation by induction.

A minimum transmission field strength is required to power a contactless IC card for operation. This minimum transmission field strength is significantly impacted by properties of the contactless IC card's internal memory. These properties include average current during a read/write access and peak currents during a read/write access. While these properties are aspects of most memories, they are most critical in non-volatile memories (NVMs) due to the high currents required to generate programming voltages.

In order to reduce the contactless IC card's power consumption and thus the minimum transmission field strength required to power the card, the current expended during a read/write access of the card's memory should be reduced. One way to reduce this current is to reduce the speed of memory access. However, reduction in access speed has the undesired result of a longer programming time.

Another way to reduce this current is to reduce the number of bits accessed in parallel. In other words, rather than program all bits at once, the programming is divided into sequential steps. However, the number of bits to be accessed is static and must be determined during the memory design stage.

SUMMARY

An apparatus and method of accessing a memory by determining available power, and accessing a number of bits of the memory in parallel, wherein the number of bits accessed in parallel is based at least in part on the available power.

DETAILED DESCRIPTION OF THE INVENTION

The present invention is directed to an apparatus and method for dynamically adjusting a number of bits of a memory to be accessed in parallel based on available field strength. This is especially important during the write/erase access performed by non-volatile memories (NVMs).

Figure 1:
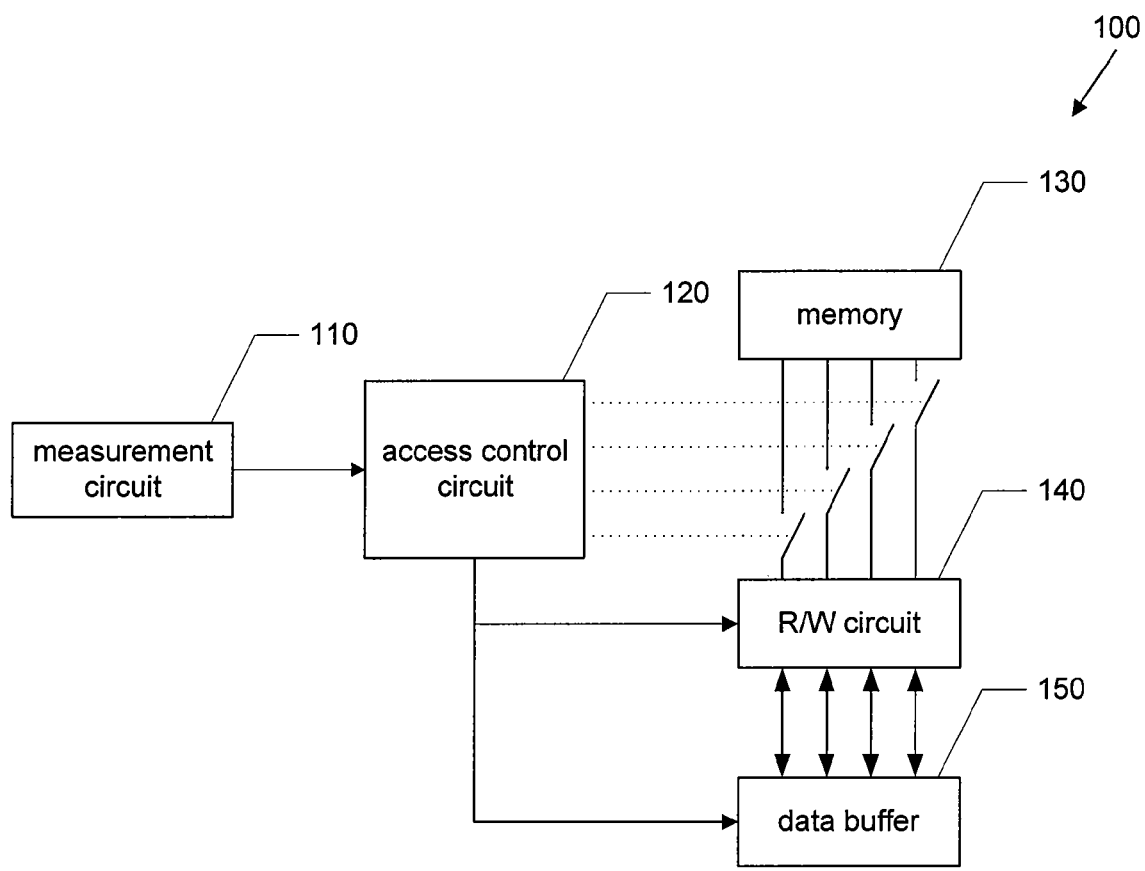
FIG. 1 is a block diagram illustrating an apparatus for accessing a memory according to an embodiment of the present invention.

FIG. 1 is a block diagram illustrating an apparatus 100 for accessing a memory as a function of available power. The apparatus 100 may be, for example, a contact-based IC card or device, a contactless IC card or device, a solar-powered device, or any other apparatus having an unstable power environment.

The apparatus 100 includes measurement circuit 110, access control circuit 120, memory 130, read/write circuit 140, and data buffer 150. Measurement circuit 110 determines power available to the apparatus 100. In the case of a contactless IC card, this power would be the RF field, and in the case of a solar-powered device, this power would be solar power. The access control circuit 120 uses this determined available power to determine dynamically how a maximum number of memory cells that can be accessed in parallel. Access control circuit 120 then uses this determined number of memory cells to control R/W circuit 140 to perform a read/write access operation on memory 130. Data buffer 150, which is also controlled by access control circuit 120, stores data received from or to be provided to read/write circuit 140.

The memory 130 may be, for example, a random access memory (RAM), a read only memory (ROM), a non-volatile memory (NVM), or any other known memory type.

The number of memory cells that can be accessed in parallel based on available power can be determined in any of a number of ways, examples of which will be described below with reference to FIGS. 2A-2C.

Figure 2A:
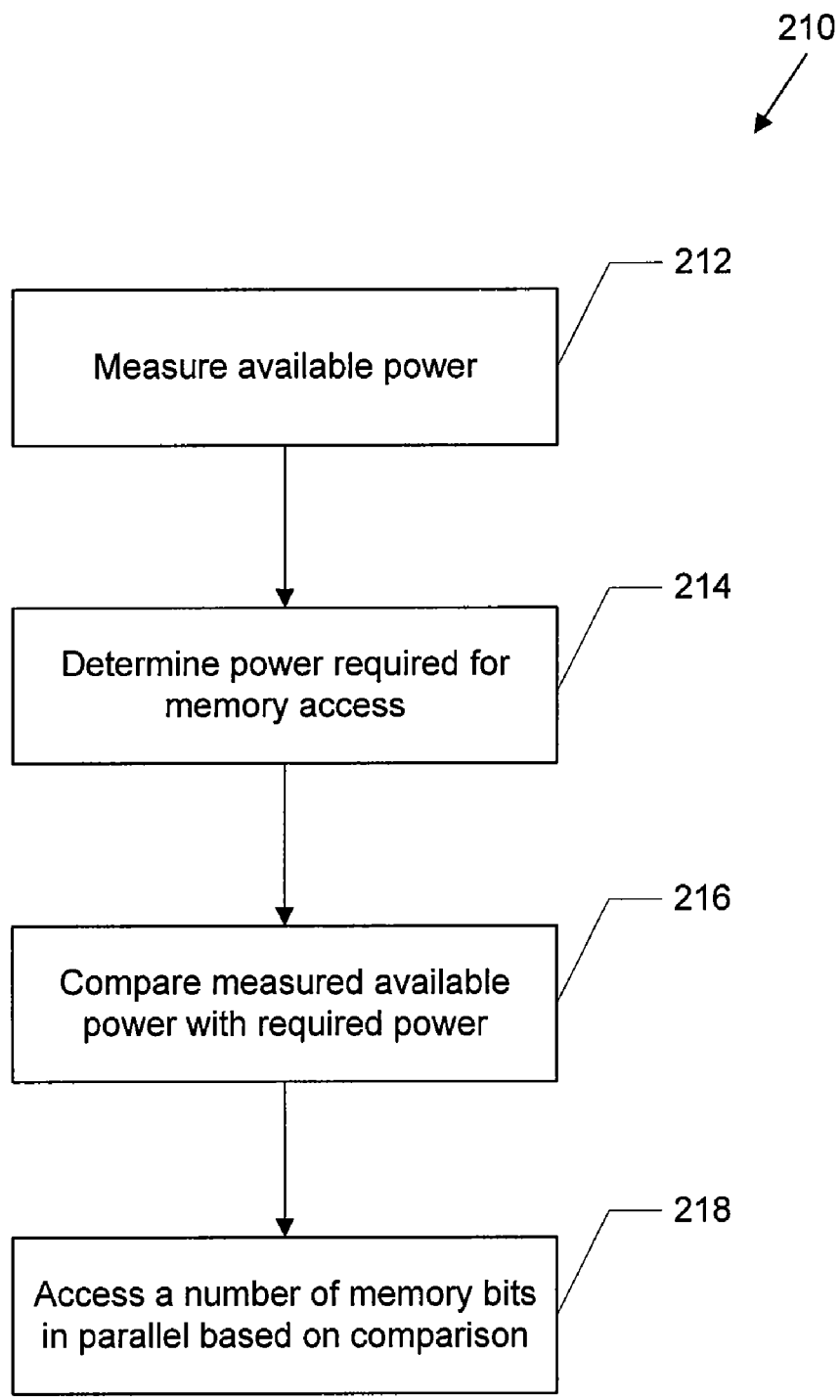
FIG. 2A is a flowchart illustrating a method for accessing a memory according to an embodiment of the present invention.

FIG. 2A is a flowchart 210 illustrating a method for accessing a memory based on measured available power using a dedicated measurement circuit according to an embodiment of the present invention.

Dedicated measurement circuit 110 measures the amount of power available to the apparatus 100 (step 212). In the case of a contactless IC card, this power would be the RF field strength, and in the case of a solar-powered device, this power would be solar power. The specific type of measurement circuit 110 would be any measurement circuit suitable for the type of power to be measured. For example, in the case of contact-based applications, the available power can be measured directly using an ampere meter.

Next, the amount of power required for memory access is determined by the access control circuit 120 (step 214). Memory developers are aware from the time of development how much power is consumed by the memory based on the number of memory bits accessed in parallel. This information may be stored within access control circuit 120 or some other memory.

Access control circuit 120 then makes a comparison between the measured, available power and the amount of power required for memory access so as to ensure that there is enough power for memory access (step 216).

Finally, access control circuit 120 uses the result of the comparison to determine the number of bits of the memory 130 to be accessed in parallel such that the fastest access speed can be acquired, while still ensuring that there is enough available power to access the memory at that speed (step 218). Access control circuit 120 then controls R/W circuit 140 and data buffer 150 to perform a read/write access to memory 130, wherein the determined number of bits are access in parallel.

Figure 2B:
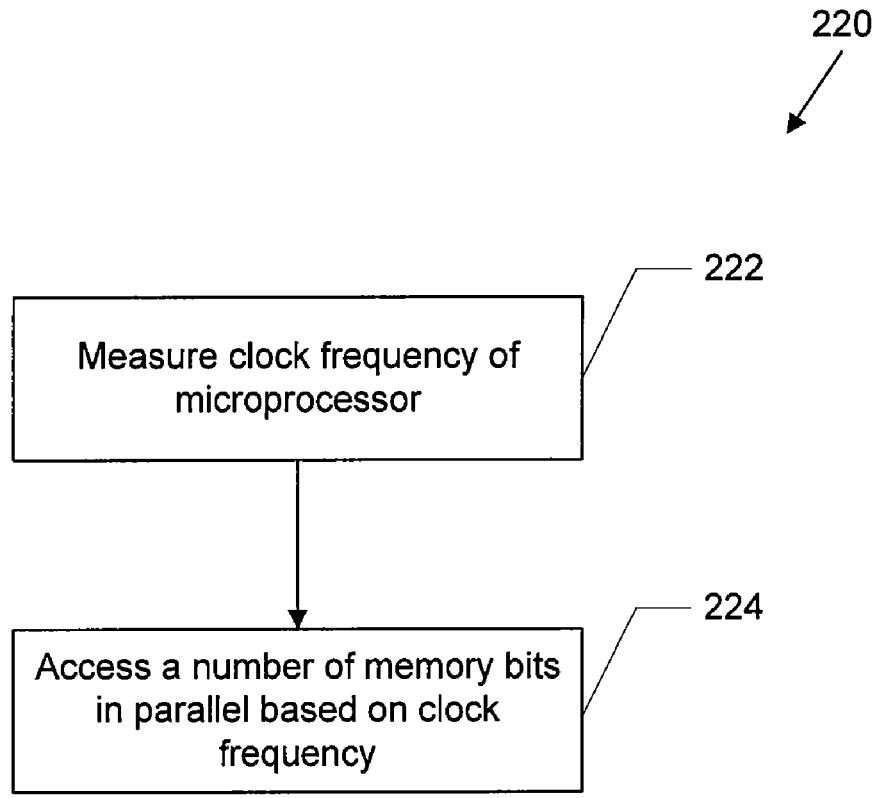
FIG. 2B is a flowchart illustrating a method for accessing a memory according to an embodiment of the present invention.

FIG. 2B is a flowchart 220 illustrating a method for accessing a memory based on a measurement of a frequency at which a controller of the apparatus is running, according to an embodiment of the present invention. This method is used, for example, for contactless IC cards in which the clock frequency is controlled by an RF field.

Measurement circuit 110 determines the amount of power available to the apparatus 100 by measuring a clock frequency of a microprocessor that controls access to the memory 130 (step 222). The available power is based at least in part on this measured clock frequency.

Access control circuit 120 uses the determined available power to determine the number of bits of the memory 130 to be accessed in parallel such that the fastest access speed can be acquired, while still ensuring that there is enough available power to access the memory at that speed (step 224). Access control circuit 120 then controls R/W circuit 140 and data buffer 150 to perform a read/write access to memory 130, wherein the determined number of bits are access in parallel.

Figure 2C:
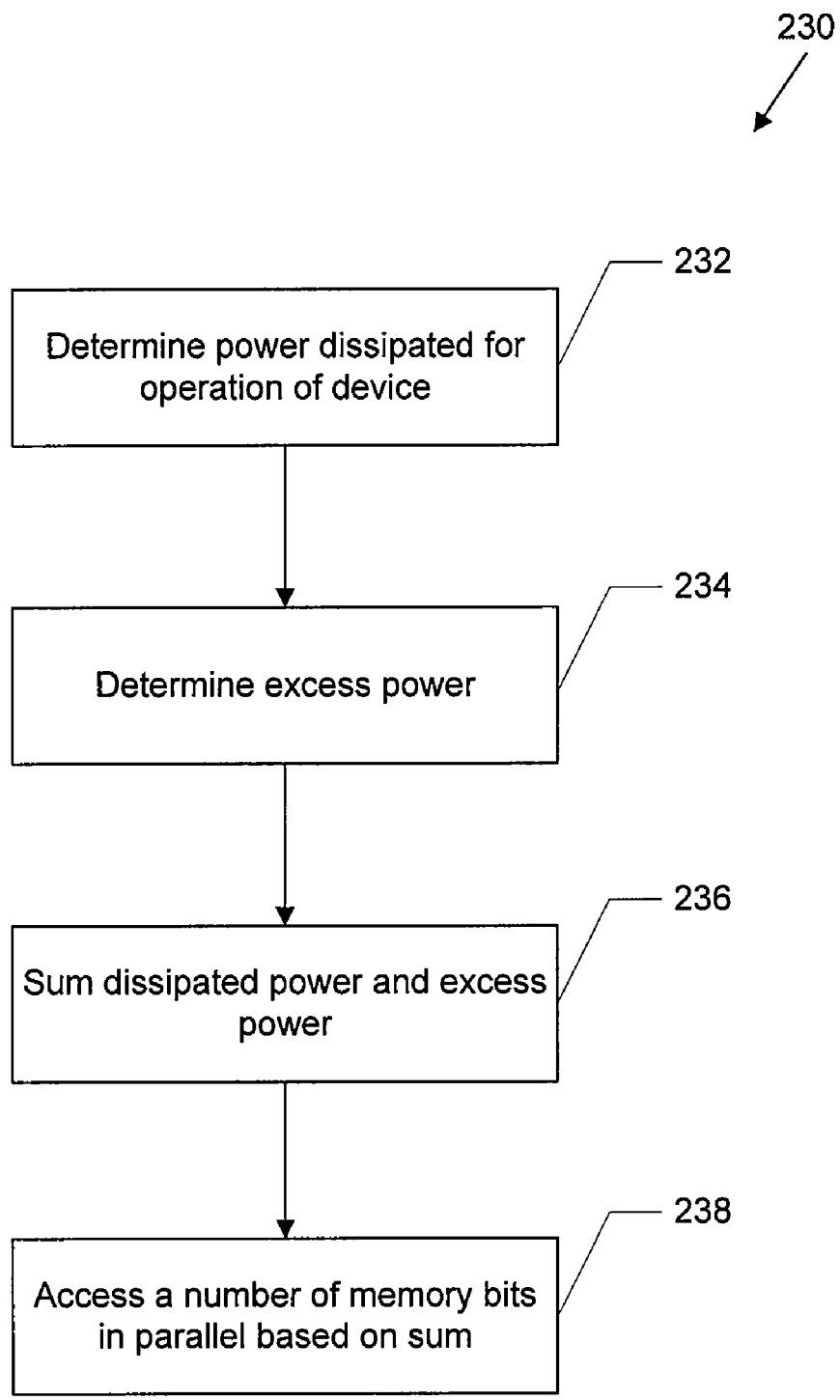
FIG. 2C is a flowchart illustrating a method for accessing a memory according to an embodiment of the present invention.

FIG. 2C is a flowchart 230 illustrating a method for accessing a memory based on a measurement of power dissipated for operation of the apparatus 100, and excess power, according to an embodiment of the present invention. This method is used, for example, in the case of a contactless IC card in which power is dissipated for operation of the contactless IC card, and excess power is wasted by a shunt to regulate the voltage.

Measurement circuit 110 determines the amount of power dissipated for operation of apparatus 100 incorporating memory 130 (step 232). Measurement circuit 110 also determines the amount of excess power (step 234). In the case of a contactless IC card, this excess power is determined by measuring the amount of current dissipated through a shunt, as is known.

Access control circuit 120 adds the amount of power dissipated for operation of apparatus 100 and the amount of excess power (step 236).

Finally, access control circuit 120 uses the sum to determine the number of bits of the memory 130 to be accessed in parallel such that the fastest access speed can be acquired, while still ensuring that there is enough available power to access the memory at that speed (step 238). Access control circuit 120 then controls R/W circuit 140 and data buffer 150 to perform a read/write access to memory 130, wherein the determined number of bits are access in parallel.

As described with respect to FIGS. 2A-2C, the number of memory cells to be accessed in parallel during a write/read access is dynamically determined as a function of available power. This available power may be determined in any of a number of ways, including one of the three ways described with respect to FIGS. 2A-2C, respectively.

Figure 3:
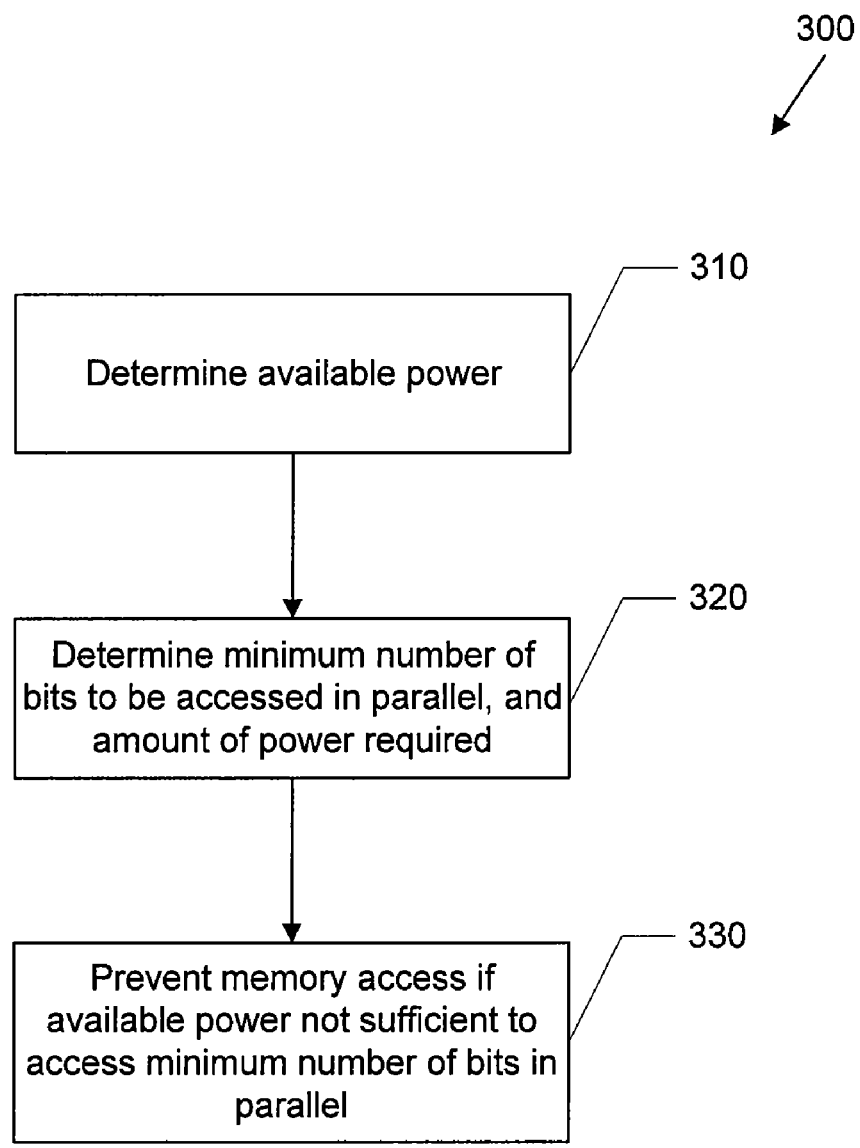
FIG. 3 is a flowchart illustrating a method for controlling access to a memory according to an embodiment of the present invention.

FIG. 3 is a flowchart 300 illustrating a method for controlling access to a memory according to an embodiment of the present invention.

Programming of the memory 130 can be prevented if not enough energy is available to write reliably at least a minimum number of memory cells in parallel reliably. If there is not enough available power, memories, and in particular NVMs, may be exposed to incorrectly written or read memory cells.

Measurement circuit 110 determines the amount of power available (step 310). This available power may be determined in any manner suitable, such as described above with respect to FIGS. 2A-2C.

Access control circuit 120 determines the minimum number of bits to be accessed in parallel, and how much power required for this access (step 320). This minimum number is known by the memory developers from the time of development, and this information may be stored within access control circuit 120 or some other memory.

Finally, access control circuit 120 prevents R/W circuit 140 from accessing memory 130 if the available power is not sufficient to access the minimum number of bits in parallel (step 330). As a result, a risk of an incorrectly written or read memory cell is reduced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of accessing a memory, comprising:
   determining available power by measuring a field strength, wherein the available power is based at least in part on the measured field strength; and
   accessing a number of bits of the memory in parallel, wherein the number of bits accessed in parallel is dynamically determined based at least in part on the available power.

2. The method of claim 1, wherein the determining comprises:
   determining power required for memory access; and
   comparing the measured field strength with the power required for memory access,
   wherein the number of bits accessed in parallel is based at least in part on the comparison.

3. The method of claim 1, wherein the field strength is measured using a measurement circuit.

4. The method of claim 3, wherein the measuring is performed continuously.

5. The method of claim 1, wherein the access is a read access.

6. The method of claim 1, wherein the access is a write access.

7. The method of claim 1, wherein the number of bits of the memory accessed in parallel results in a maximum access speed for the available power.

8. An apparatus, comprising:
   a memory;
   a read/write circuit;
   an access controller configured to determine a number of bits of the memory to be accessed in parallel, wherein the number of bits accessed in parallel is dynamically determined based at least in part on available power; and
   a measurement circuit configured to measure a field strength, wherein the available power is based at least in part on the measured field strength.

9. The apparatus of claim 8, further comprising a data buffer configured to store data received from or to be provided to the read/write circuit.

10. The apparatus of claim 8, wherein the apparatus is a contactless card.

11. The apparatus of claim 8, wherein the memory is a non-volatile memory.

12. The apparatus of claim 8, wherein the apparatus is a solar-powered device.

13. The apparatus of claim 8, wherein the number of bits of the memory accessed in parallel results in a maximum access speed for the available power.

14. A method of controlling accessing to a memory, comprising:
- determining available power by measuring a field strength, wherein the available power is based at least in part on the measured field strength;
- dynamically determining a minimum number of bits to be accessed in parallel; and
- preventing access to the memory if the available power is not sufficient to access the minimum number of bits in parallel.

15. A system, comprising:
- a memory;
- a read/write circuit; and
- an access control means for determining a number of bits of the memory to be accessed in parallel, wherein the number of bits accessed in parallel is dynamically determined based at least in part on available power; and
- a measurement means for measuring a field strength, wherein the available power is based at least in part on the measured field strength.

16. The system of claim 15, wherein the number of bits of the memory accessed in parallel results in a maximum access speed for the available power.

\* \* \* \* \*